United States Patent
Song et al.

(10) Patent No.: US 8,004,886 B2
(45) Date of Patent: Aug. 23, 2011

(54) APPARATUS AND METHOD OF MULTI-BIT PROGRAMMING

(75) Inventors: Seung-Hwan Song, Incheon (KR); Kyoung Lae Cho, Yongin-si (KR); Heeseok Eun, Seoul (KR); Dong Hyuk Chae, Seoul (KR); Jun Jin Kong, Yongin-si (KR); Sung Chung Park, Daejeon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 396 days.

(21) Appl. No.: 12/073,101

(22) Filed: Feb. 29, 2008

(65) Prior Publication Data
US 2009/0103359 A1   Apr. 23, 2009

(30) Foreign Application Priority Data
Oct. 17, 2007   (KR) .................. 10-2007-0104657

(51) Int. Cl.
*G11C 16/04*   (2006.01)
(52) U.S. Cl. .................. 365/185.03; 365/185.22
(58) Field of Classification Search ......... 365/185.03 O, 365/185.09, 185.11, 185.12, 185.22 X, 185.03, 365/185.22
See application file for complete search history.

(56) References Cited

U.S. PATENT DOCUMENTS

| | | | |
|---|---|---|---|
| 5,982,663 A | 11/1999 | Park et al. | |
| 6,075,723 A * | 6/2000 | Naiki et al. | 365/185.03 |
| 7,193,897 B2 | 3/2007 | Lee | |
| 7,492,641 B2 * | 2/2009 | Hosono et al. | 365/185.22 |
| 7,525,870 B2 * | 4/2009 | Erez | 365/238.5 |
| 7,551,487 B2 * | 6/2009 | Park et al. | 365/185.22 |
| 7,554,842 B2 * | 6/2009 | Barzilai et al. | 365/185.03 |
| 7,583,545 B2 * | 9/2009 | Lasser | 365/189.16 |
| 7,646,636 B2 * | 1/2010 | Kim | 365/185.03 |
| 2006/0171210 A1 * | 8/2006 | Nagashima et al. | 365/189.01 |
| 2006/0221696 A1 | 10/2006 | Li et al. | |
| 2007/0070696 A1 * | 3/2007 | Avraham et al. | 365/185.09 |
| 2007/0253249 A1 | 11/2007 | Kang et al. | |

FOREIGN PATENT DOCUMENTS

| | | |
|---|---|---|
| JP | 10-011980 | 1/1998 |
| JP | 2007-004868 | 1/2007 |
| KR | 1020010070086 | 7/2001 |
| KR | 1020030051043 | 6/2003 |
| KR | 1020050002245 | 1/2005 |
| KR | 1020060109348 | 10/2006 |

OTHER PUBLICATIONS

International Search Report dated May 20, 2008.

* cited by examiner

*Primary Examiner* — VanThu Nguyen
(74) *Attorney, Agent, or Firm* — Harness, Dickey & Pierce, P.L.C.

(57) ABSTRACT

Multi-bit programming apparatuses and/or methods are provided. A multi-bit programming apparatus may comprise: a multi-bit cell array that includes a first multi-bit cell and a second multi-bit cell; a programming unit for programming first data in the first multi-bit cell, and programming second data in the second multi-bit cell; and a verification unit for verifying whether the first data is programmed in the first multi-bit cell using a first verification voltage, and verifying whether the second data is programmed in the second multi-bit cell using a second verification voltage. The multi-bit programming apparatus may generate better threshold voltage distributions in a multi-bit cell memory.

17 Claims, 13 Drawing Sheets

APPARATUS AND METHOD OF MULTI-BIT PROGRAMMING

PRIORITY STATEMENT

This application claims priority under 35 U.S.C. §119 to Korean Patent Application No. 10-2007-0104657, filed on Oct. 17, 2007, in the Korean Intellectual Property Office (KIPO), the entire contents of which are incorporated herein by reference.

BACKGROUND

1. Field

Example embodiments relate to apparatuses and methods that may program data in memory devices. Additionally, example embodiments relate to multi-bit (multi-level) programming apparatuses and methods that may program data in multi-level memory devices.

2. Description of Related Art

A single-level cell (SLC) memory device may store one bit of data in a single memory cell. The SLC memory may be referred to as a single-bit cell (SBC) memory. The SLC memory may store and read data of one bit at a voltage level included in one of two voltage distributions that may be divided by a threshold voltage level programmed in a memory cell. The programmed threshold voltage may have a distribution within a certain range due to a fine electric characteristic difference between the SLC memories. For example, when a voltage level read from the memory cell is greater than 0.5V and less than 1.5V, it may be determined that the data stored in the memory cell has a logic value of "1". When the voltage level read from the memory cell is greater than 2.5V and less than 3.5V, it may determined that the data stored in the memory cell has a logic value of "0". The data stored in the memory cell may be classified depending on the difference between cell currents and/or cell voltages during the reading operations.

A multi-level cell (MLC) memory device, which may store data of two or more bits in a single memory cell, has been proposed in response to a need for higher integration of memory. The MLC memory device may also be referred to as a multi-bit cell (MBC) memory. However, as the number of bits stored in a single memory cell increases, reliability may deteriorate and read-failure rates may increase. To store 'm' bits in a single memory cell, $2^m$ voltage level distributions may be required. But, since the voltage window for a memory device may be limited, the difference in threshold voltages between adjacent bits may decrease as 'm' increases, which may cause the read-failure rate to increase. For this reason, it may be difficult to improve storage density using the MLC memory device according to conventional art.

SUMMARY

Example embodiments may provide apparatuses and/or methods that may apply a new multi-level (multi-bit) programming scheme to a multi-level cell (MLC) memory device, and thereby may generate an optimum distribution in an MLC memory device.

Example embodiments may provide multi-bit programming apparatuses and methods to reduce a read-failure rate when storing data and reading the stored data by using an MLC memory device.

Example embodiments may also provide apparatuses and/or methods that may apply a new multi-level (multi-bit) programming scheme to an MLC memory device, and thereby may reduce an error when reading data stored in the MLC memory device.

Example embodiments also may provide apparatuses and/or methods that may apply a new reading scheme when reading data stored in an MLC memory device, and thereby may minimize an error when reading the data.

According to example embodiments, a multi-bit programming apparatus may comprise: a multi-bit cell array that may include a first multi-bit cell and a second multi-bit cell; a programming unit that may program first data in the first multi-bit cell, and may program second data in the second multi-bit cell; and a verification unit that may verify whether the first data is programmed in the first multi-bit cell using a first verification voltage, and may verify whether the second data is programmed in the second multi-bit cell using a second verification voltage.

According to example embodiments, a memory data detection apparatus may comprise: a multi-bit cell array that may include a first multi-bit cell and a second multi-bit cell; and a data detection unit that may detect first data programmed in the first multi-bit cell using a first detection voltage, and may detect second data programmed in the second multi-bit cell using a second detection voltage.

According to example embodiments, a multi-bit programming method may include: programming first data in the first multi-bit cell; programming second data in the second multi-bit cell; verifying whether the first data is programmed in the first multi-bit cell using a first verification voltage; and verifying whether the second data is programmed in the second multi-bit cell using a second verification voltage.

According to example embodiments, a memory data detection method may include: setting a first detection voltage and a second detection voltage; detecting first data programmed in the first multi-bit cell using the first detection voltage; and detecting second data programmed in the second multi-bit cell using the second detection voltage.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Figure 1:
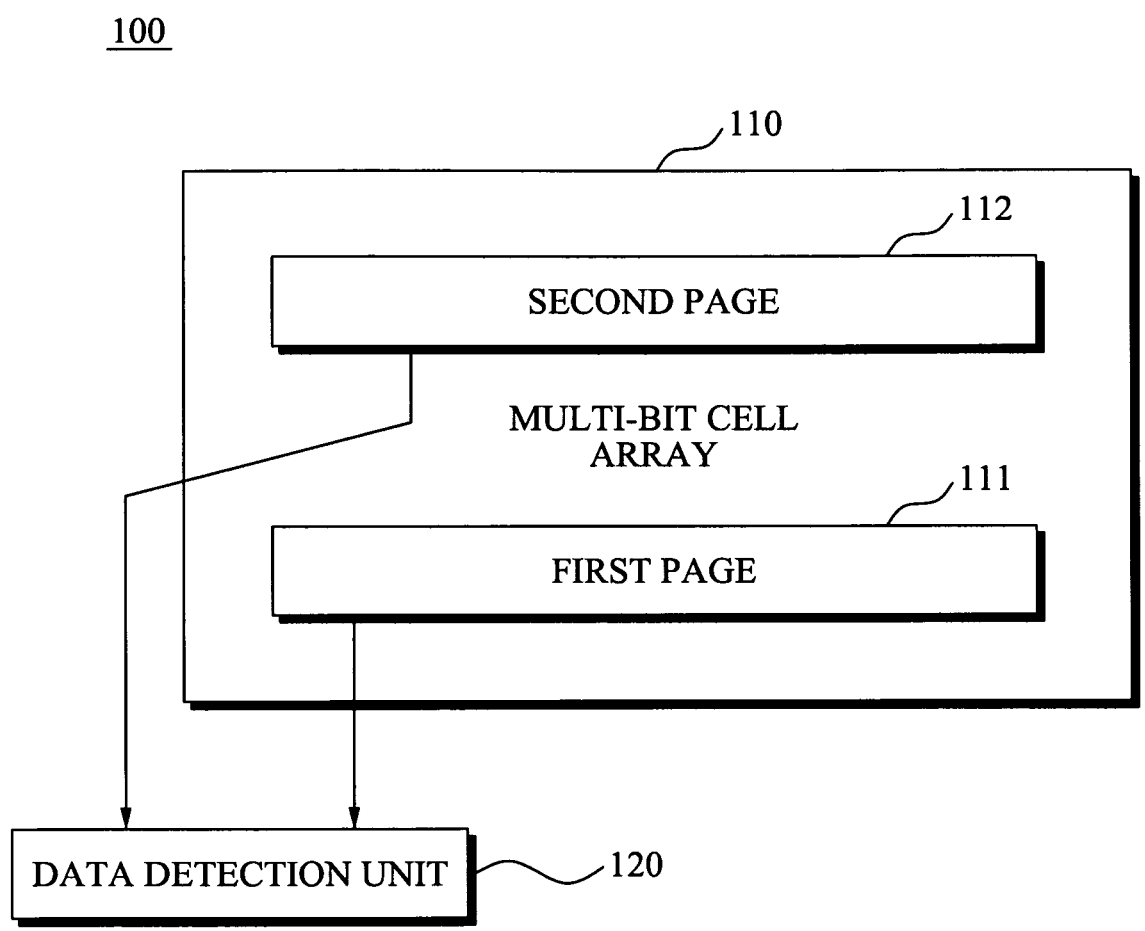
FIG. 1 is a diagram illustrating a memory data detection apparatus according to example embodiments.

Example embodiments will now be described more fully with reference to the accompanying drawings. Embodiments, however, may be embodied in many different forms and should not be construed as being limited to example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

A page may be defined as a minimum unit that may simultaneously store data, and may include a plurality of multi-bit cells. A multi-bit programming apparatus may reduce a time required for storing the data by storing the data in the plurality of multi-bit cells simultaneously.

One page may include the plurality of multi-bit cells connected with one word line.

FIG. 1 is a diagram illustrating a memory data detection apparatus 100 according to example embodiments.

Referring to FIG. 1, the memory data detection apparatus 100 may include a multi-bit cell array 110 and a data detection unit 120.

The multi-bit cell array 110 may include a first page 111 and a second page 112.

The first page 111 may include a plurality of first multi-bit cells, and the second page 112 may include a plurality of second multi-bit cells.

Data programmed in the plurality of first multi-bit cells of the first page 111 may be referred to as first data, and data programmed in the plurality of second multi-bit cells of the second page 112 may be referred to as second data.

The data detection unit 120 may detect first data using a first detection voltage, and may detect second data using a second detection voltage. The first and second data detection voltages may be different from one another.

A detection voltage may also be referred to as a read voltage.

According to example embodiments, the first detection voltage and the second detection voltage may be determined based on which of the first page 111 and the second page 112 is first programmed.

Figure 2:
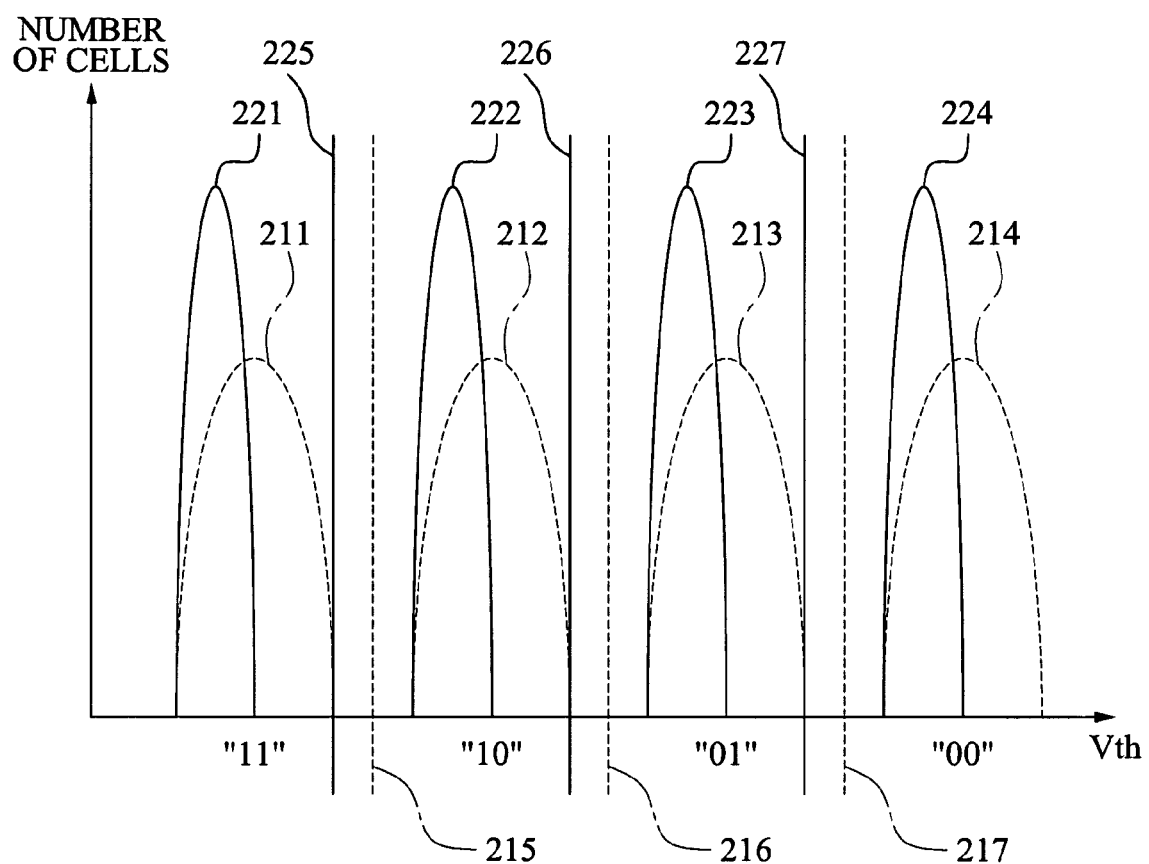
FIG. 2 is a graph illustrating a data detection process performed by the memory data detection apparatus of FIG. 1 according to example embodiments.

FIG. 2 is a graph illustrating a data detection process performed by the memory data detection apparatus of FIG. 1 according to example embodiments.

A horizontal axis of FIG. 2 may denote threshold voltages of multi-bit cells, and a vertical axis of FIG. 2 may denote a number of multi-bit cells corresponding to the threshold voltages. The number of multi-bit cells corresponding to the threshold voltages may be referred to as a distribution.

Referring to FIG. 2, the plurality of first multi-bit cells included in the first page 111 may generate distribution states 211, 212, 213, and 214.

Depending on example embodiments, the distribution state 211 may denote a distribution of the plurality of first multi-bit cells in which data "11" is programmed. The distribution state 212 may denote a distribution of the plurality of first multi-bit cells in which data "10" is programmed, the distribution state 213 may denote a distribution of the plurality of first multi-bit cells in which data "01" is programmed, and the distribution state 214 may denote a distribution of the plurality of first multi-bit cells in which data "00" is programmed.

It may be statistically demonstrated that when a number of the plurality of first multi-bit cells in the first page 111 is sufficient, the distribution state 211 may be regarded as the probabilities of threshold voltage values of the plurality of first multi-bit cells in which data "11" is programmed.

Similarly, the distribution state 212 may be regarded as the probabilities of threshold voltage values of the plurality of first multi-bit cells in which data "10" is programmed.

The data detection unit 120 may determine which of the distribution states 211, 212, 213, and 214 corresponds to each of the plurality of first multi-bit cells by using voltage levels 215, 216, and 217. The data detection unit 120 may determine the distribution state of each of the plurality of first multi-bit cells, and may detect the first data programmed in each of the plurality of first multi-bit cells.

The data detection unit 120 may select the voltage levels 215, 216, and 217 as the first detection voltage. The voltage level 215 of the first detection voltage may be selected to be appropriate for determining the distribution state 211 and the distribution state 212. Depending on example embodiments, the voltage level 215 may be selected to have an average value of the distribution state 211 and the distribution state 212.

Similarly, the voltage level 216 may be selected to have an average value of the distribution state 212 and the distribution state 213. The voltage level 217 may be selected to have an average value of the distribution state 213 and the distribution state 214.

The plurality of second multi-bit cells which may be included in the second page 112 may generate distribution states 221, 222, 223, and 224.

The distribution state 221 may denote a distribution of the plurality of second multi-bit cells in which data "11" is programmed, the distribution state 222 may denote a distribution of the plurality of second multi-bit cells in which data "10" is programmed, the distribution state 223 may denote a distribution of the plurality of second multi-bit cells in which data "01" is programmed, and the distribution state 224 may denote a distribution of the plurality of second multi-bit cells in which data "00" is programmed.

The data detection unit 120 may determine which of the distribution states 221, 222, 223, and 224 corresponds to each of the plurality of second multi-bit cells by using voltage levels 225, 226, and 227. The data detection unit 120 may determine the distribution state of each of the plurality of second multi-bit cells, and may detect the second data programmed in each of the plurality of second multi-bit cells.

The data detection unit 120 may select the voltage levels 225, 226, and 227 as the second detection voltage.

The voltage level 225 may be selected to be appropriate for determining the distribution state 221 and the distribution state 222. Depending on example embodiments, the voltage level 225 may be selected to have an average value of the distribution state 221 and the distribution state 222.

Similarly, the voltage level 226 may be selected to have an average value of the distribution state 222 and the distribution state 223. The voltage level 227 may be selected to have an average value of the distribution state 223 and the distribution state 224.

The memory data detection apparatus 100 may enable a voltage level more appropriate for the distribution state of each multi-bit cell to be selected as the detection voltage by applying different voltage levels to the first page 111 and the second page 112.

For example, when the memory data detection apparatus 100 determines the distribution state 211 and the distribution state 212, the voltage level 215 may be more appropriate than the voltage level 225. Conversely, when the memory data detection apparatus 100 determines the distribution state 221 and the distribution state 222, the voltage level 225 may be more appropriate than the voltage level 215.

Depending on example embodiments, the distribution state may be determined based on which of the first page 111 and the second page 112 is first programmed.

When the first page 111 is programmed before the second page 112, the plurality of multi-bit cells of the first page 111 may have the distribution being more spread than the plurality of multi-bit cells of the second page 112 due to a mechanism such as high voltage stress and program disturbance.

The second page 112 may be programmed after the first page 111 is first programmed. While the second page 112 is programmed, the plurality of first multi-bit cells of the first page 111 may be affected by a programming process of the second page 112 causing an undesired distribution.

In this case, the distribution states 211, 212, 213, and 214 of the plurality of first multi-bit cells of the first page 111 may have forms being more spread than the distribution states 221, 222, 223, and 224 of the plurality of second multi-bit cells of the second page 112.

As illustrated in FIG. 2, a difference between the first detection voltage levels 215, 216, and 217, and the second detection voltage levels 225, 226, and 227 may be generated by a difference between the distribution states 211, 212, 213, and 214 of the plurality of first multi-bit cells, and the distribution states 221, 222, 223, and 224 of the plurality of second multi-bit cells.

The memory data detection apparatus 100 according to example embodiments may estimate a change amount of the distribution of the threshold voltages of the plurality of first multi-bit cells and the plurality of second multi-bit cells based on a programming sequence of the first page 111 and the second page 112.

The memory data detection apparatus 100 may determine the first detection voltage and the second detection voltage based on the estimated change amount of the distribution.

Figure 3:
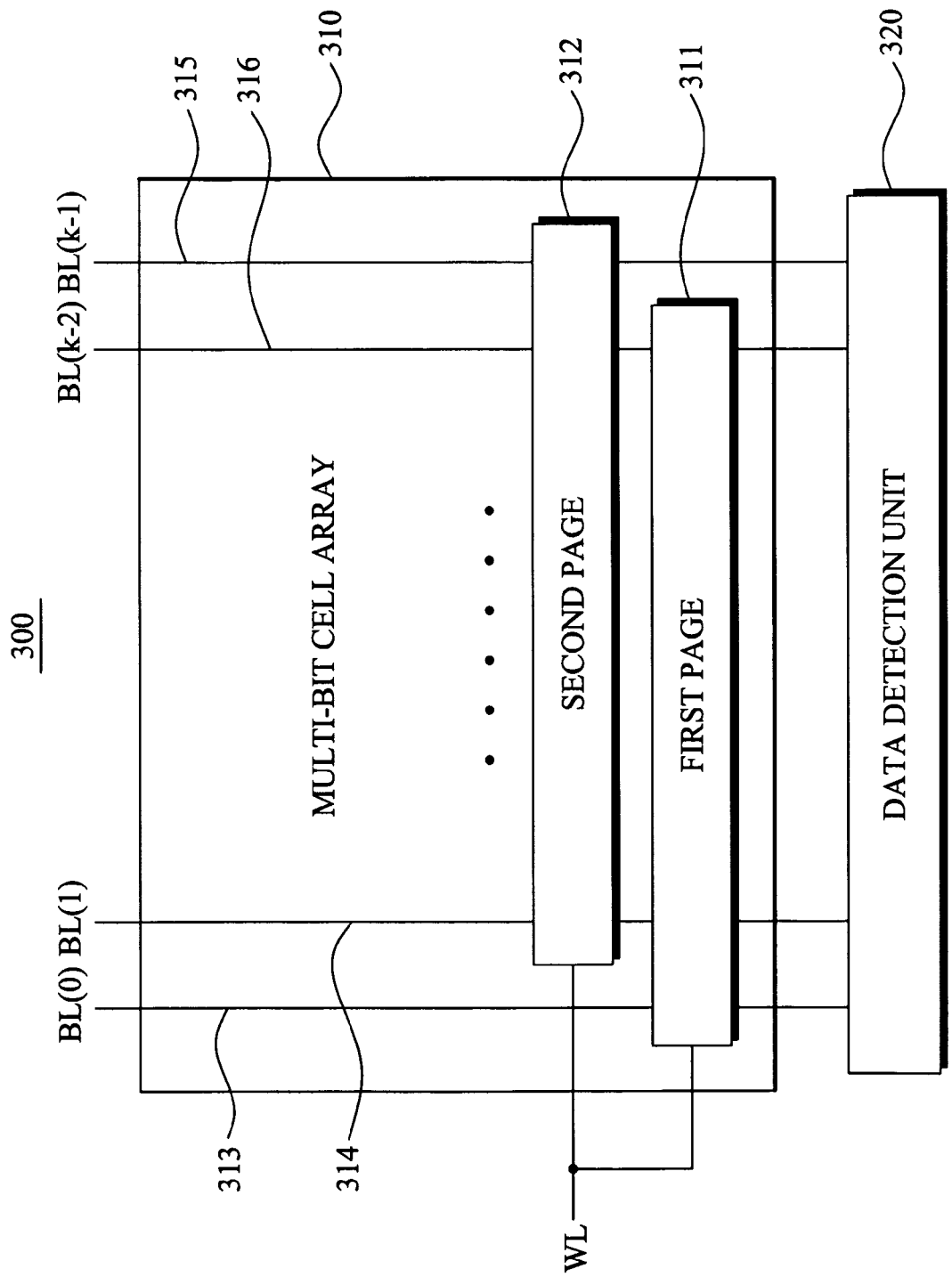
FIG. 3 is a diagram illustrating a memory data detection apparatus according to example embodiments.

FIG. 3 is a diagram illustrating a memory data detection apparatus 300 according to example embodiments.

Referring to FIG. 3, the memory data detection apparatus 300 may include a multi-bit cell array 310 and a data detection unit 320.

The multi-bit cell array 310 may include a first page 311 and a second page 312. The first page 311 may include a plurality of first multi-bit cells, and the second page 312 may include a plurality of second multi-bit cells.

All multi-bit cells included in the first page 311 and the second page 312 may be connected with a word line (WL). Each of the first page 311 and the second page 312 may include k/2 multi-bit cells, k being an even natural number.

The first page 311 may include a multi-bit cell connected with a bit line (BL)(0) 313 and a multi-bit cell connected with a BL(k-2) 316. The plurality of first multi-bit cells included in the first page 311 may include multi-bit cells connected with even bit lines of the multi-bit cells connected with the WL.

The second page 312 may include a multi-bit cell connected with a BL(1) 314 and a multi-bit cell connected with a BL(k-1) 315. The plurality of second multi-bit cells included in the second page 312 may include multi-bit cells connected with odd bit lines of the multi-bit cells connected with the WL.

The data detection unit 120 may detect the first data using a first detection voltage, and detect the second data using a second detection voltage.

The first detection voltage may be determined based on a fact that the plurality of first multi-bit cells is connected with the even bit lines.

The second detection voltage may be determined based on a fact that the plurality of second multi-bit cells is connected with the odd bit lines.

Generally, a highly integrated memory may dispose memory cells (referred to as A) connected with the even bit lines, and memory cells (referred to as B) connected with the odd bit lines in an alternating fashion in order to increase integration of the memory cells. The highly integrated memory may classify the memory cells into overlapping memory cells A and memory cells B, and may perform a read/write operation. Specifically, the highly integrated memory may perform the read/write operation for memory cells A and memory cells B separately.

In example embodiments, the plurality of first multi-bit cells connected with the even bit lines may be programmed before the plurality of second multi-bit cells.

While the plurality of second multi-bit cells is programmed, the plurality of first multi-bit cells may be affected by a programming operation of the plurality of second multi-bit cells which may cause an undesired distribution.

As the distribution state of the plurality of first multi-bit cells spreads while programming the plurality of second multi-bit cells, the first detection voltage levels may be determined to be different from the second detection voltage levels.

Figure 4:
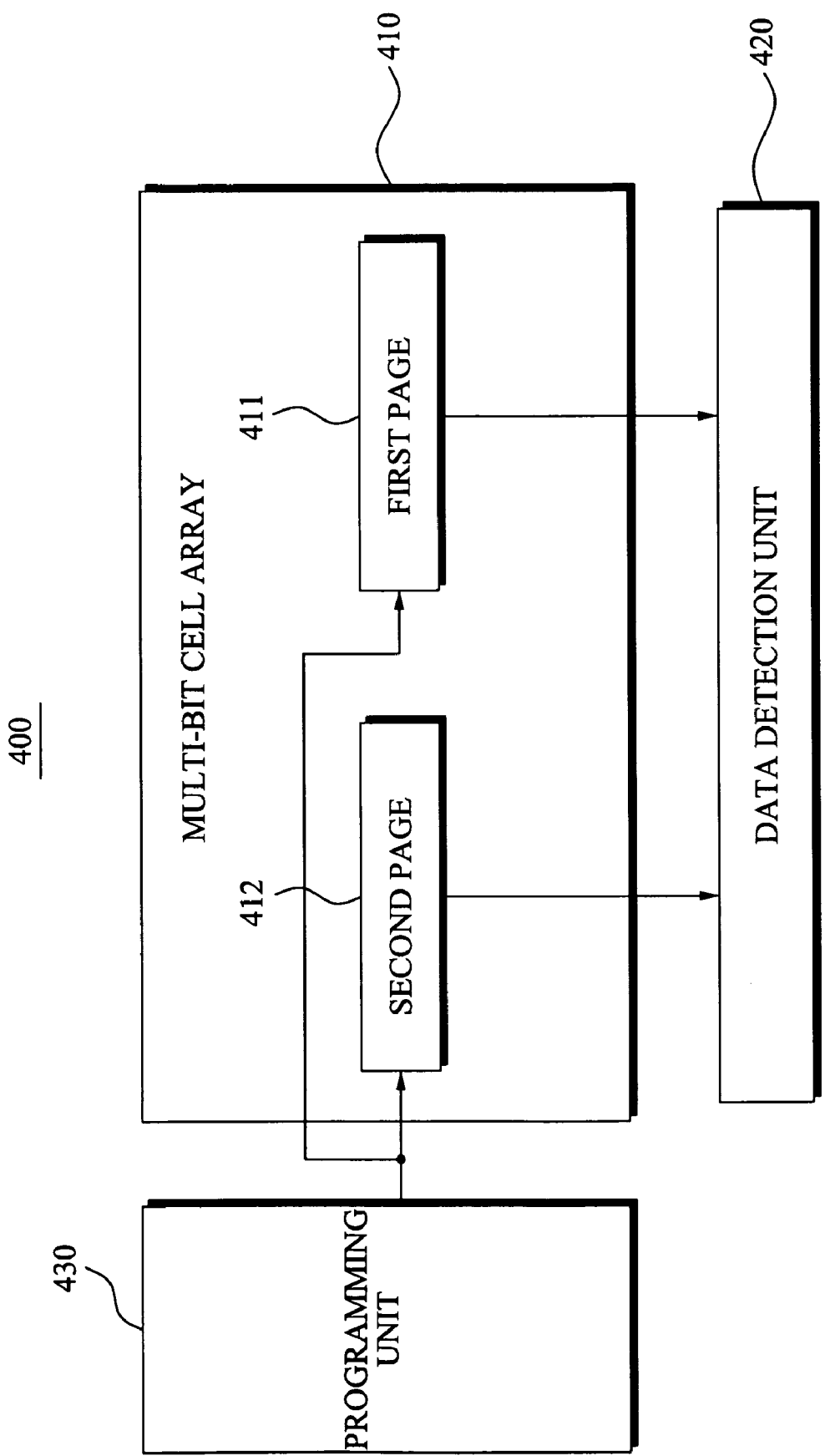
FIG. 4 is a diagram illustrating a memory data detection apparatus according to example embodiments.

FIG. 4 is a diagram illustrating a memory data detection apparatus 400 according to example embodiments.

Referring to FIG. 4, the memory data detection apparatus 400 may include a multi-bit cell array 410, a data detection unit 420, and a programming unit 430.

The multi-bit cell array 410 may include a first page 411 and a second page 412.

The first page 411 may include a plurality of first multi-bit cells, and the second page 412 may include a plurality of second multi-bit cells.

The data detection unit 420 may detect first data programmed in the plurality of first multi-bit cells using a first detection voltage, and may detect second data programmed in the plurality of second multi-bit cells using a second detection voltage.

The programming unit 430 may program data in at least one of the plurality of first multi-bit cells and the plurality of second multi-bit cells by applying a high voltage to a gate terminal of at least one of the plurality of first multi-bit cells and the plurality of second multi-bit cells.

As illustrated in FIG. 4, the first page 411 may be located farther from the programming unit 430 than the second page 412.

Generally, the programming unit 430 may apply the high voltage to the gate terminal of at least one of the plurality of first multi-bit cells and the plurality of second multi-bit cells via a conductor line.

The conductor line may be formed of a metal including aluminum, copper, and the like, or may be formed of a doped poly-silicon.

As integration of the multi-bit cell array 410 increases, the conductor line may need to be thinned, and a distance between conductor lines may need to be decreased.

As the conductor line thins and lengthens, a resistance of the conductor line may increase, and as the distance between conductor lines decreases, a parasitic capacitance between conductor lines may increase.

Generally, it is known that time delay of a signal in an electric circuit may be proportional to a value calculated by multiplying the resistance and the capacitance.

In the multi-bit cell array 410 having very high integration, the conductor line to the first page 411, which may be located relatively farther from the programming unit 430, may have a resistance and a parasitic capacitance greater than the conductor line to the second page 412, which may be located relatively closer to the programming unit 430.

Accordingly, the first high voltage applied from the programming unit 430 to the first page 411 may have a time delay longer than the second high voltage applied from the programming unit 430 to the second page 412. Also, it may be more difficult for the programming unit 430 to control accurately the first high voltage than it is to control accurately the second high voltage.

In example embodiments, threshold voltages of the plurality of first multi-bit cells of the first page 411 may be located relatively farther from the programming unit 430 and may have a distribution state being more spread than threshold voltages of the plurality of second multi-bit cells of the second page 412, which may be located closer to the programming unit 430.

A data detection process of the memory data detection apparatus 400 may be described with reference to FIG. 2 as an example.

For example, the plurality of first multi-bit cells of the first page 411 may have the distribution states 211, 212, 213, and 214.

In example embodiments, the plurality of second multi-bit cells of the second page 412 may have the distribution states 221, 222, 223, and 224.

The first detection voltages of the plurality of first multi-bit cells may correspond to the voltage levels 215, 216, and 217, and the second detection voltages of the plurality of second multi-bit cells may correspond to the voltage levels 225, 226, and 227.

The first detection voltages may be determined based on the distribution states 211, 212, 213, and 214 of the plurality of first multi-bit cells, and the distribution states 211, 212, 213, and 214 of the plurality of first multi-bit cells may be determined based on a spatial distance between the first page 411 and the programming unit 430.

Similarly, the second detection voltages may be determined based on the distribution states 221, 222, 223, and 224 of the plurality of second multi-bit cells, and the distribution states 221, 222, 223, and 224 of the plurality of second multi-bit cells may be determined based on a spatial distance between the second page 412 and the programming unit 430.

Depending on example embodiments, the memory data detection apparatus 400 may estimate the distribution of the threshold voltages of the plurality of first multi-bit cells and the plurality of second multi-bit cells based on the spatial distances of the first page 111 and the programming unit 430, and the second page 112 and the programming unit 430.

The memory data detection apparatus 400 may determine the first detection voltage and the second detection voltage based on the estimated distribution of the threshold voltages.

In example embodiments, the memory data detection apparatus 400 may estimate the distribution of the threshold voltages of the plurality of first multi-bit cells and the plurality of second multi-bit cells based on the parasitic capacitance and the resistance of the conductor line connected with the gate terminal of the plurality of first multi-bit cells and the plurality of second multi-bit cells.

Figure 5:
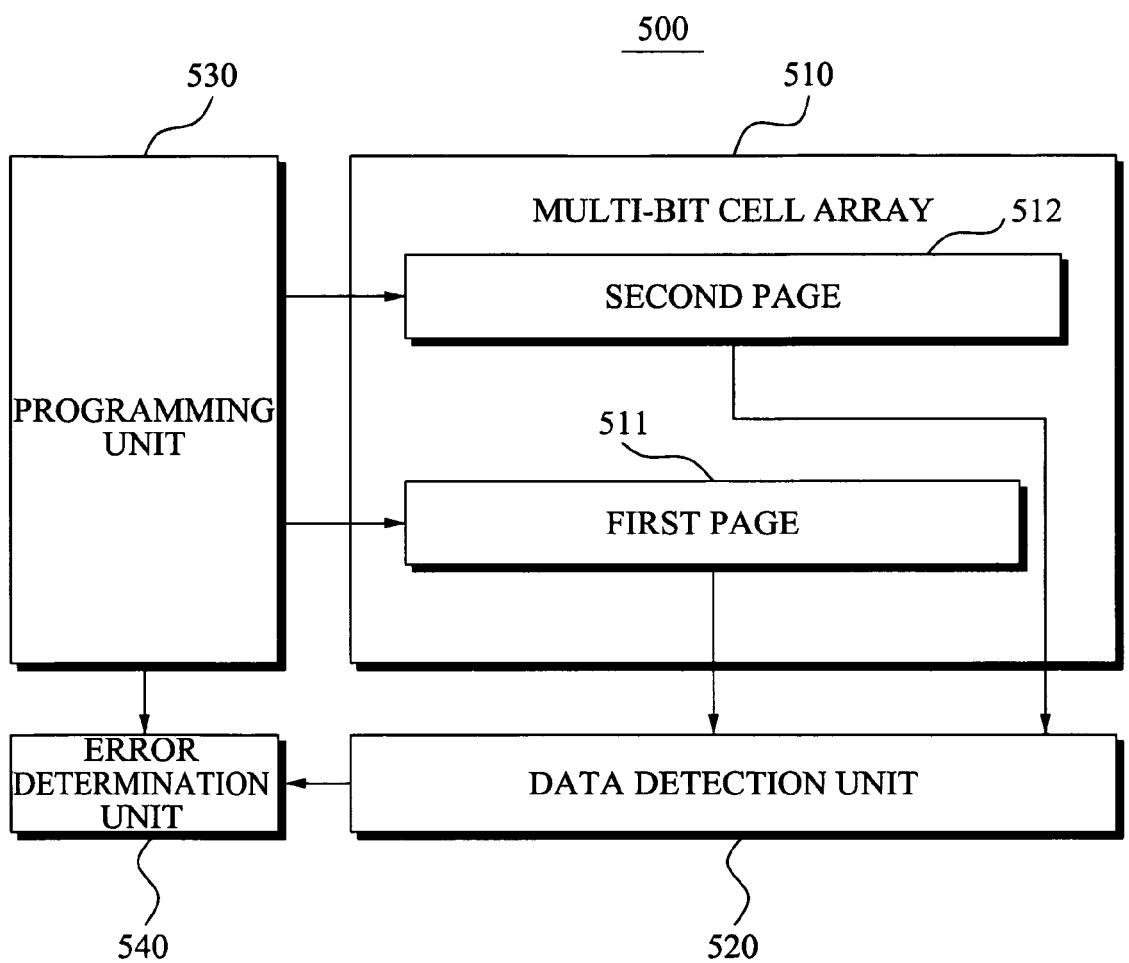
FIG. 5 is a diagram illustrating a memory data detection apparatus according to example embodiments.

FIG. 5 is a diagram illustrating a memory data detection apparatus 500 according to example embodiments.

Referring to FIG. 5, the memory data detection apparatus 500 may include a multi-bit cell array 510, a data detection unit 520, a programming unit 530, and an error determination unit 540.

The multi-bit cell array 510 may include a first page 511 and a second page 512.

The first page 511 may include a plurality of first multi-bit cells, and the second page 512 may include a plurality of second multi-bit cells.

The data detection unit 520 may detect first data programmed in the plurality of first multi-bit cells using a first detection voltage, and may detect second data programmed in the plurality of second multi-bit cells using a second detection voltage.

The programming unit 530 may program first original data in the plurality of first multi-bit cells by applying a high voltage to a gate terminal of the plurality of first multi-bit cells, and may program second original data in the plurality of second multi-bit cells by applying a high voltage to a gate terminal of the plurality of second multi-bit cells.

The error determination unit 540 may determine whether the first data detected by the data detection unit 520 corresponds to the first original data. Depending on example embodiments, when the first data is different from the first original data, the error determination unit 540 may determine that the first data has an error.

The error determination unit 540 may determine whether the second data detected by the data detection unit 520 corresponds to the second original data. Depending on example embodiments, when the second data is different from the second original data, the error determination unit 540 may determine that the second data has an error.

The memory data detection apparatus 500 may generate first data error statistics based on a determination result of the error determination unit 540 with respect to the first data, and may generate second data error statistics based on a determination result of the error determination unit 540 with respect to the second data.

The memory data detection apparatus 500 may determine the first detection voltage based on the first data error statistics, and may determine the second detection voltage based on the second data error statistics.

A data detection process of the memory data detection apparatus 500 may be described with reference to FIG. 2 as an example.

As an example, the plurality of first multi-bit cells of the first page 511 may have the distribution states 211, 212, 213, and 214.

In example embodiments, the plurality of second multi-bit cells of the second page 512 may have the distribution states 221, 222, 223, and 224.

It is assumed that some of the plurality of first multi-bit cells in which original data "11" is programmed may have the distribution state 211, and some others of the plurality of first multi-bit cells in which original data "10" is programmed may have the distribution state 212.

When the data detection unit 520 determines, using the voltage level 225, which of the distribution state 211 and the distribution state 212 corresponds to each of the plurality of first multi-bit cells, the data detection unit 520 may determine that a portion of the plurality of first multi-bit cells in which original data "11" is programmed have the distribution state 212 since the portion of the plurality of first multi-bit cells may have the threshold voltages higher than the voltage level 225. Accordingly, the probability that the portion of the plurality of first multi-bit cells is mis-determined may not be ignored.

When it is determined that the portion of the plurality of first multi-bit cells in which original data "11" is programmed have the distribution state 212, the data detection unit 520 may detect the first data of the portion of the plurality of first multi-bit cells as "10".

Since first data "10" detected from the portion of the plurality of first multi-bit cells is different from the first original data "11" programmed in the portion of the plurality of first multi-bit cells, the error determination unit 540 may determine that an error exists in the portion of the plurality of first multi-bit cells.

When the data detection unit 520 determines, using the voltage level 215, which of the distribution state 211 and the distribution state 212 corresponds to each of the plurality of first multi-bit cells, a probability that some of the plurality of first multi-bit cells in which original data "11" is programmed may have the threshold voltages higher than the voltage level 215 may be very low. Accordingly, the probability that the data detection unit 520 determines that the portion of the plurality of first multi-bit cells have the distribution state 212 may be negligible.

Accordingly, an error generation frequency of the first data when the data detection unit 520 uses the voltage level 215 may be less than an error generation frequency of the first data when data detection unit 520 uses the voltage level 225.

The memory data detection apparatus 500 may select the voltage level 215 based on the first data error statistics, and may determine the voltage level 215 as one of the first detection voltages.

Similarly, the memory data detection apparatus 500 may select the voltage level 225 based on the second data error statistics, and may determine the voltage level 225 as one of the second detection voltages.

Figure 6:
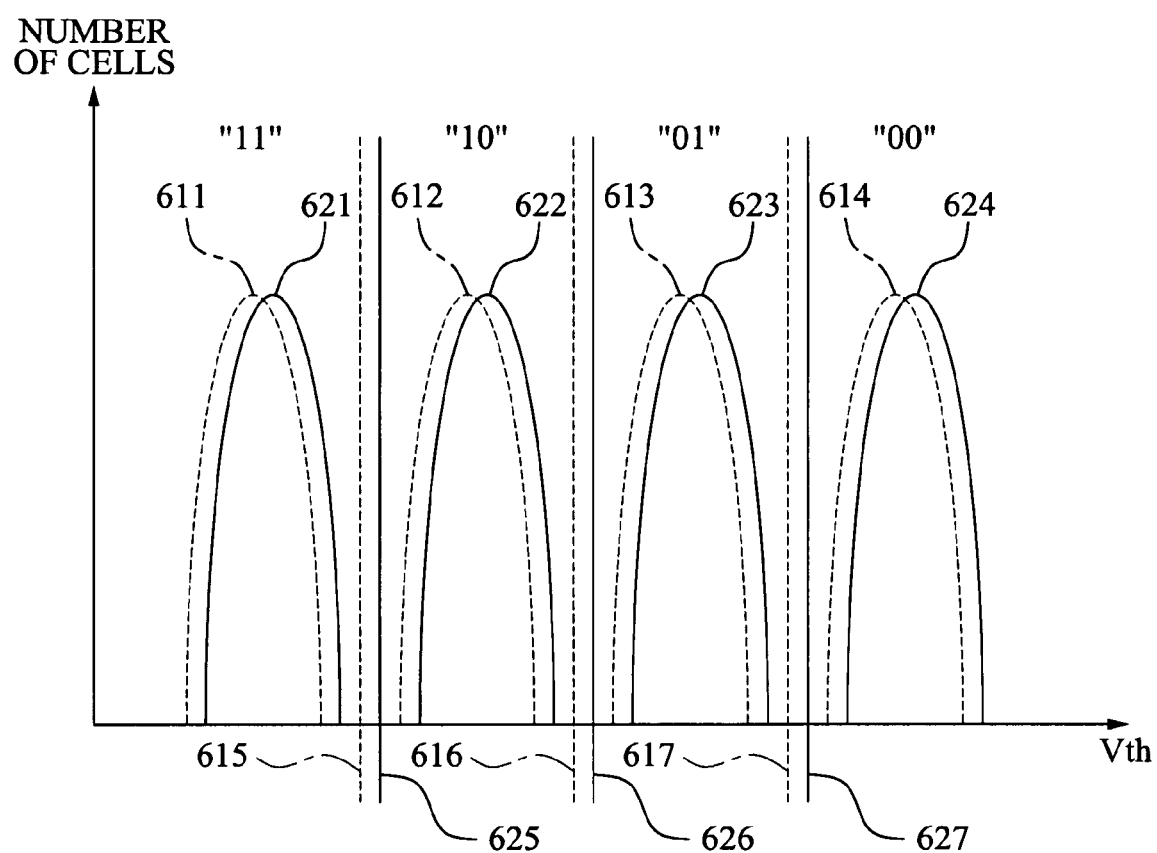
FIG. 6 is a graph illustrating a data detection process performed by the memory data detection apparatus of FIG. 1 according to example embodiments.

FIG. 6 is a graph illustrating the data detection process performed by the memory data detection apparatus 100 of FIG. 1 according to example embodiments.

A horizontal axis of FIG. 6 may denote threshold voltages of multi-bit cells, and a vertical axis of FIG. 6 may denote a number of multi-bit cells corresponding to the threshold voltages.

Referring to FIG. 6, the plurality of first multi-bit cells included in the first page 111 may have distribution states 611, 612, 613, and 614.

Depending on example embodiments, the distribution state 611 may denote a distribution of the plurality of first multi-bit cells in which data "11" is programmed. In example embodiments, the distribution state 612 may denote a distribution of the plurality of first multi-bit cells in which data "10" is programmed, and the distribution state 613 may denote a distribution of the plurality of first multi-bit cells in which data "01" is programmed. Also, the distribution state 614 may denote a distribution of the plurality of first multi-bit cells in which data "00" is programmed.

As described above, it may be statistically demonstrated that when a number of the plurality of first multi-bit cells in the first page 111 is sufficient, the distribution state 611 may be regarded as a probability of threshold voltage values of the plurality of first multi-bit cells in which data "11" is programmed.

Similarly, the distribution state 612 may be regarded as a probability of threshold voltage values of the plurality of first multi-bit cells in which data "10" is programmed.

The plurality of second multi-bit cells included in the second page 112 may have distribution states 621, 622, 623, and 624.

Depending on example embodiments, the distribution state 621 may denote a distribution of the plurality of second multi-bit cells in which data "11" is programmed. In example embodiments, the distribution state 621 may be regarded as a probability of threshold voltage values of the plurality of second multi-bit cells in which data "11" is programmed.

In example embodiments, a number of programmings and erasures of the plurality of first multi-bit cells may be greater than a number of programmings and erasures of the plurality of second multi-bit cells.

Generally, it is known that as a number of programmings and erasures of a memory cell increases in a non-volatile memory, a charge retention characteristic of the memory cell may become degraded.

A threshold voltage of the memory cell of the non-volatile memory may be determined based on a charge amount charged in a floating gate of the memory cell.

The threshold voltage of the memory cell immediately after data is programmed in the memory cell may be referred to as a first threshold voltage, and the threshold voltage of the memory cell when an amount of time passed after the data is programmed in the memory cell may be referred to as a second threshold voltage. The charge retention characteristic may degrade as the number of programmings and erasures of the memory cell increases. Accordingly, a difference between the first threshold voltage and the second threshold voltage may increase as the number of programmings and erasures of the memory cell increases.

Therefore, the threshold voltages of the plurality of first multi-bit cells according to example embodiments may decrease from a value immediately after programming as time passes after programming.

Conversely, the threshold voltages of the plurality of second multi-bit cells may maintain a value immediately after programming regardless of an amount of time passed after programming.

As illustrated in FIG. 6, the distribution states 611, 612, 613, and 614 of the threshold voltages of the plurality of first multi-bit cells may be located more to the left than the distribution states 621, 622, 623, and 624 of the threshold voltages of the plurality of second multi-bit cells. Specifically, FIG. 6 illustrates that the threshold voltages of the plurality of first multi-bit cells may be lower than the threshold voltages of the plurality of second multi-bit cells.

The memory data detection apparatus 100 according to the present example embodiment may estimate a change amount of the threshold voltages based on the number of programmings and erasures of the plurality of first multi-bit cells, and may determine the first detection voltage based on the estimated change amount of the threshold voltages.

The memory data detection apparatus 100 may select the voltage levels 615, 616, and 617 as the first detection voltage.

The memory data detection apparatus 100 may estimate a change amount of the threshold voltages based on the number of programmings and erasures of the plurality of second multi-bit cells, and may determine the second detection voltage based on the estimated change amount of the threshold voltages.

The memory data detection apparatus 100 may select the voltage levels 625, 626, and 627 as the second detection voltage.

Figure 7:
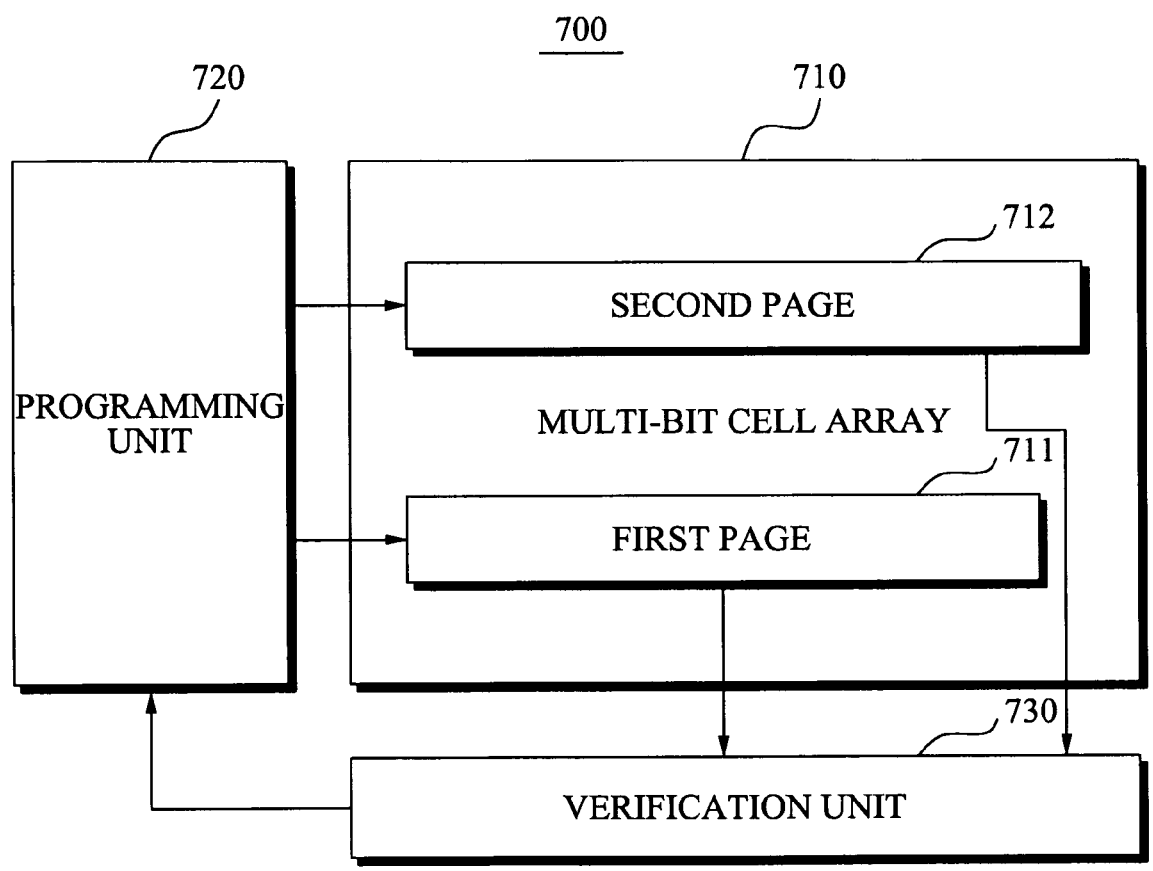
FIG. 7 is a diagram illustrating a multi-bit programming apparatus according to example embodiments.

FIG. 7 is a diagram illustrating a multi-bit programming apparatus 700 according to example embodiments.

Referring to FIG. 7, the multi-bit programming apparatus 700 may include a multi-bit cell array 710, a programming unit 720, and a verification unit 730.

The multi-bit cell array 710 may include a first page 711 and a second page 712.

The first page 711 may include a plurality of first multi-bit cells, and the second page 712 may include a plurality of second multi-bit cells.

The programming unit 720 may program first data in the plurality of first multi-bit cells, and may program second data in the plurality of second multi-bit cells.

The verification unit 730 may verify whether the first data is programmed in the plurality of first multi-bit cells using a first verification voltage, and may verify whether the second data is programmed in the plurality of second multi-bit cells using a second verification voltage. The first and second verification voltages may be different from one another.

The verification unit 730 may compare the first verification voltage and threshold voltages of the plurality of first multi-bit cells, and may repeatedly determine whether to perform a programming operation of the plurality of first multi-bit cells based on a comparison result.

Additionally, the verification unit 730 may compare the second verification voltage and threshold voltages of the plurality of second multi-bit cells, and may repeatedly determine whether to perform a programming operation of the plurality of second multi-bit cells based on a comparison result.

Figure 8:
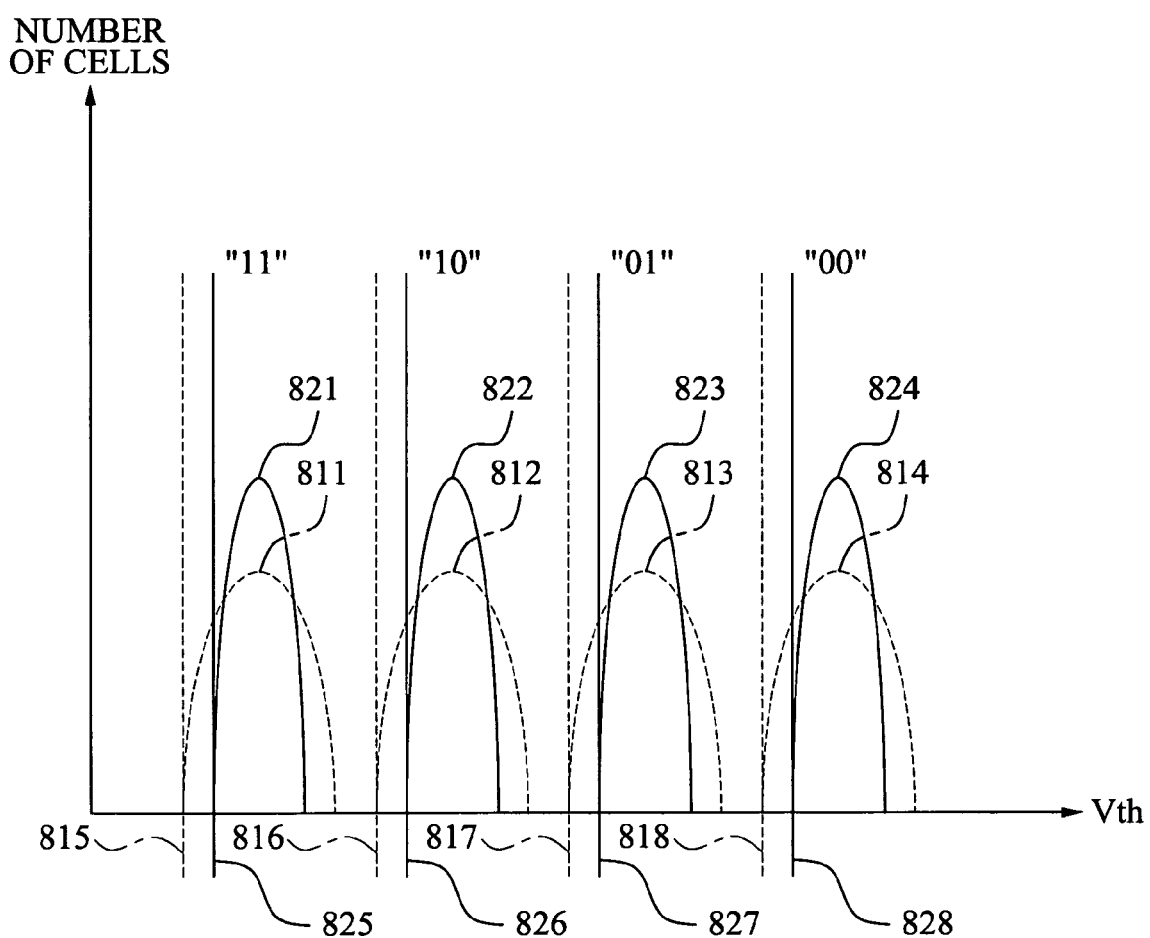
FIG. 8 is a graph illustrating a programming and verification process of the multi-bit programming apparatus of FIG. 7 according to example embodiments.

FIG. 8 is a graph illustrating a programming and verification process of the multi-bit programming apparatus 700 of FIG. 7 according to example embodiments.

A horizontal axis of FIG. 8 may denote threshold voltages of multi-bit cells, and a vertical axis of FIG. 8 may denote a number of multi-bit cells corresponding to the threshold voltages. The number of multi-bit cells corresponding to the threshold voltages may be referred to as a distribution. As described above, the distribution may be regarded as a probability of the threshold voltages of multi-bit cells.

Referring to FIG. 8, the verification unit 730 may select voltage levels 815, 816, 817, and 818 as the first verification voltage, and may verify whether the first data is programmed in the plurality of first multi-bit cells using the selected first verification voltage.

In example embodiments, programming of the programming unit 720 may increase the threshold voltages of the plurality of first multi-bit cells and the plurality of second multi-bit cells.

The verification unit 730 may detect the threshold voltage of the first multi-bit cell in which first data "10" is programmed. The verification unit 730 may compare the detected threshold voltage and the voltage level 816. When the detected threshold voltage is lower than the voltage level 816, the verification unit 730 may repeatedly perform programming of the first multi-bit cell. When the detected threshold voltage is higher than the voltage level 816, the verification unit 730 may complete the programming of the first multi-bit cell.

In example embodiments, the distribution of the threshold voltages of the plurality of first multi-bit cells in which first data "10" is programmed may generate a distribution state 812.

The verification unit 730 may detect the threshold voltage of the first multi-bit cell in which first data "01" is programmed. The verification unit 730 may compare the detected threshold voltage and the voltage level 817. When the detected threshold voltage is lower than the voltage level 817, the verification unit 730 may repeatedly perform programming of the first multi-bit cell. When the detected threshold voltage is higher than the voltage level 817, the verification unit 730 may complete the programming of the first multi-bit cell.

In example embodiments, the distribution of the threshold voltages of the plurality of first multi-bit cells in which first data "01" is programmed may generate a distribution state 813.

Similarly, the verification unit 730 may detect the threshold voltage of the first multi-bit cell in which first data "00" is programmed. The verification unit 730 may compare the detected threshold voltage and the voltage level 818. When the detected threshold voltage is lower than the voltage level 818, the verification unit 730 may repeatedly perform programming of the first multi-bit cell. When the detected threshold voltage is higher than the voltage level 818, the verification unit 730 may complete the programming of the first multi-bit cell.

In example embodiments, the distribution of the threshold voltages of the plurality of first multi-bit cells in which first data "00" is programmed may generate a distribution state 814.

The distribution of the threshold voltages of the plurality of first multi-bit cells in which first data "11" is programmed may generate the distribution state 811.

The verification unit 730 may select voltage levels 825, 826, 827, and 828 as the second verification voltage, and may verify whether the second data is programmed in the plurality of second multi-bit cells using the selected second verification voltage.

The distribution of the threshold voltages of the plurality of second multi-bit cells in which second data "11" is programmed may generate a distribution state 821.

The verification unit 730 may detect the threshold voltage of the second multi-bit cell in which second data "10" is programmed. The verification unit 730 may compare the detected threshold voltage and the voltage level 826. When the detected threshold voltage is lower than the voltage level 826, the verification unit 730 may repeatedly perform programming of the second multi-bit cell. When the detected threshold voltage is higher than the voltage level 826, the verification unit 730 may complete the programming of the second multi-bit cell.

In example embodiments, the distribution of the threshold voltages of the plurality of second multi-bit cells in which second data "10" is programmed may generate a distribution state 822.

The verification unit 730 may detect the threshold voltage of the second multi-bit cell in which second data "01" is programmed. The verification unit 730 may compare the detected threshold voltage and the voltage level 827. When the detected threshold voltage is lower than the voltage level 827, the verification unit 730 may repeatedly perform programming of the second multi-bit cell. When the detected threshold voltage is higher than the voltage level 827, the verification unit 730 may complete the programming of the second multi-bit cell.

In example embodiments, the distribution of the threshold voltages of the plurality of second multi-bit cells in which second data "01" is programmed may generate a distribution state 823.

Similarly, the verification unit 730 may detect the threshold voltage of the second multi-bit cell in which second data "00" is programmed. The verification unit 730 may compare the detected threshold voltage and the voltage level 828. When the detected threshold voltage is lower than the voltage level 828, the verification unit 730 may repeatedly perform programming of the second multi-bit cell. When the detected threshold voltage is higher than the voltage level 828, the verification unit 730 may complete the programming of the second multi-bit cell.

In example embodiments, the distribution of the threshold voltages of the plurality of second multi-bit cells in which second data "00" is programmed may generate a distribution state 824.

Depending on example embodiments, the first verification voltage and the second verification voltage may be determined based on which of the first page 711 and the second page 712 is first programmed.

In example embodiments, the first page 711 may be programmed before the second page 712.

As described above, the first-programmed first page 711 may be affected by programming of the second page 712 while programming the second page 712 causing an undesired and spread distribution. Examples of a mechanism affecting the first page 711 may include program disturbance and the like.

In the present example embodiment, the distribution of the threshold voltages of the plurality of first multi-bit cells may generate the distribution states 811, 812, 813, and 814.

The distribution of the threshold voltages of the plurality of second multi-bit cells may generate the distribution states 821, 822, 823, and 824.

As illustrated in FIG. 8, the distribution states 811, 812, 813, and 814 of the threshold voltages of the plurality of first multi-bit cells may have forms being more spread than the distribution states 821, 822, 823, and 824 of the threshold voltages of the plurality of second multi-bit cells.

The multi-bit programming apparatus 700 according to example embodiments may determine a first verification voltage and a second verification voltage based on a fact that the distribution states 811, 812, 813, and 814 of the threshold voltages of the plurality of first multi-bit cells may have forms being more spread than the distribution states 821, 822, 823, and 824 of the threshold voltages of the plurality of second multi-bit cells.

Depending on example embodiments, the first verification voltage may be determined based on first data error statistics of the first multi-bit cell, and the second verification voltage may be determined based on second data error statistics of the second multi-bit cell.

The multi-bit programming apparatus 700 according to example embodiments may compare the first data programmed in the first multi-bit cell and first output data detected from the first multi-bit cell. When the first data and the first output data are different from each other, the memory data detection apparatus 700 may determine that an error of the first multi-bit cell exists.

The multi-bit programming apparatus 700 may generate statistics of the generated error of the first multi-bit cell, and may determine the first verification voltage based on the generated first data error statistics.

Similarly, the multi-bit programming apparatus 700 according to example embodiments may compare the second data programmed in the second multi-bit cell and second output data detected from the second multi-bit cell. When the second data and the second output data are different from each other, the memory data detection apparatus 700 may determine that an error of the second multi-bit cell exists. The multi-bit programming apparatus 700 may generate statistics of the generated error of the second multi-bit cell, and may determine the second verification voltage based on the generated second data error statistics.

Depending on example embodiments, the first verification voltage may be determined based on a number of programmings and erasures of the first multi-bit cell, and the second verification voltage may be determined based on a number of programmings and erasures of the second multi-bit cell.

A programming and verification process of the multi-bit programming apparatus 700 according to the present example embodiment may be described with reference to FIG. 10.

Figure 10:
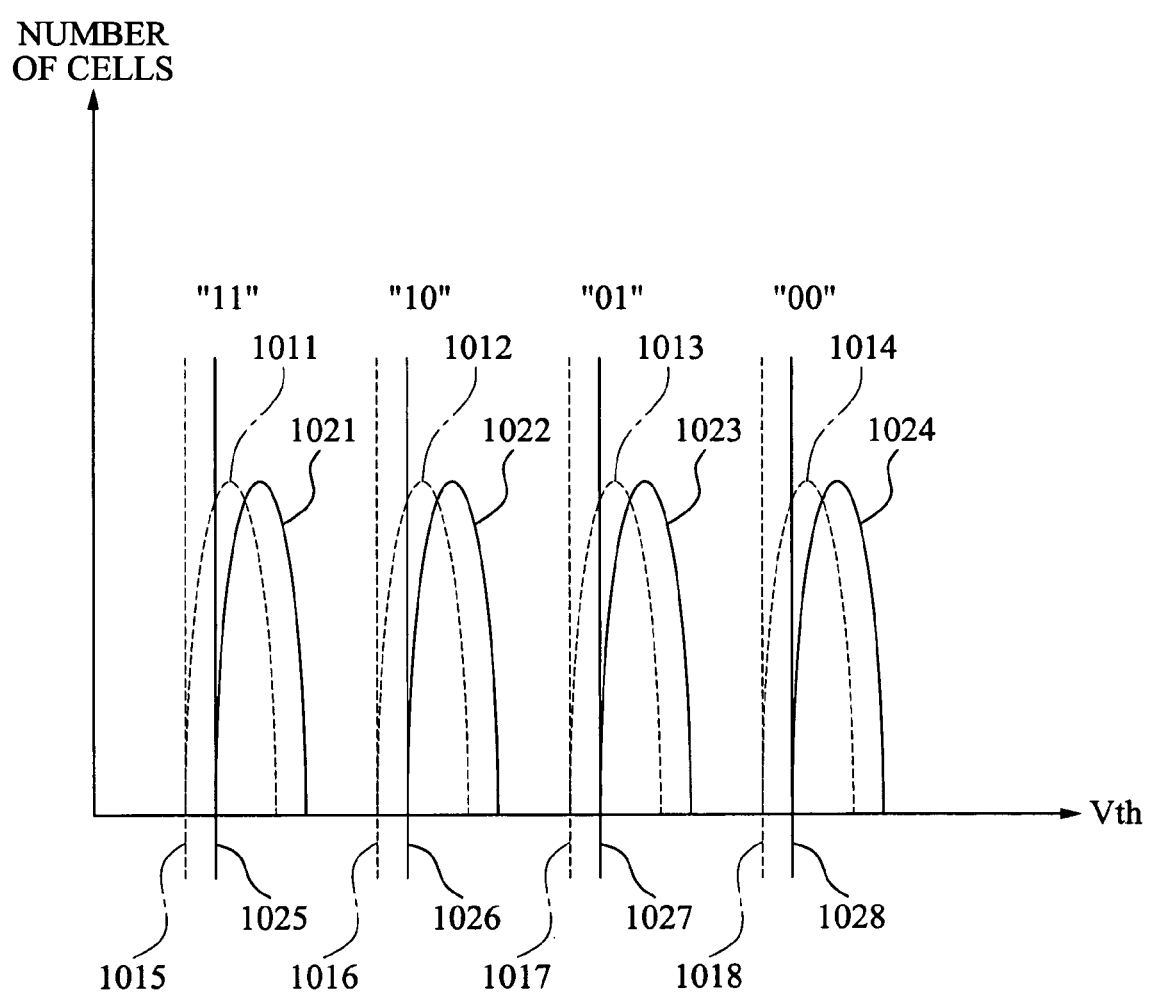
FIG. 10 is a graph illustrating a programming and verification process of the multi-bit programming apparatus of FIG. 7 according to example embodiments.

FIG. 10 is a graph illustrating a programming and verification process of the multi-bit programming apparatus of FIG. 7 according to example embodiments.

Referring to FIG. 10, a horizontal axis of FIG. 10 may denote threshold voltages of multi-bit cells, and a vertical axis of FIG. 10 may denote a number of multi-bit cells having values of the threshold voltages. The number of multi-bit cells having the values of the threshold voltages may be referred to as a distribution.

Generally, it is well-known that as a number of programmings and erasures of the multi-bit cell increases, a programming characteristic of the multi-bit cell may become degraded.

In example embodiments, programming may increase the threshold voltage of the multi-bit cell.

When a number of programmings and erasures of a plurality of first multi-bit cells is sufficiently greater than a number of programmings and erasures of a plurality of second multi-bit cells, the threshold voltages of the plurality of first multi-bit cells may become lower than the threshold voltages of the plurality of second multi-bit cells after a predetermined time passes after identical programming.

In example embodiments, as illustrated in FIG. 10, the multi-bit programming apparatus 700 may select voltage levels 1025, 1026, 1027, and 1028 for the plurality of first multi-bit cells, and may determine the selected voltage levels as the first verification voltage.

The multi-bit programming apparatus 700 may select voltage levels 1015, 1016, 1017, and 1018 for the plurality of second multi-bit cells, and may determine the selected voltage levels as the second verification voltage.

The threshold voltages of the plurality of first multi-bit cells may have distribution states 1021, 1022, 1023, and 1024 immediately after programming and verification, and the threshold voltages of the plurality of second multi-bit cells may have distribution states 1011, 1012, 1013, and 1014.

The threshold voltages of the plurality of first multi-bit cells in which first data "00" is programmed may have distribution state 1024, and the threshold voltages of the plurality of second multi-bit cells in which second data "00" is programmed may have distribution state 1014.

Accordingly, the distributions of the threshold voltages of the plurality of first multi-bit cells and the plurality of second multi-bit cells after the predetermined time passes may be maintained to have similar standards by variously adjusting the first verification voltage and the second verification voltage immediately after programming.

Depending on example embodiments, the multi-bit programming apparatus 700 may estimate a change amount of the threshold voltage of the first multi-bit cell after a predetermined time passes after programming based on a number of programmings and erasures of the first multi-bit cell. The multi-bit programming apparatus 700 may determine the first verification voltage based on the estimated change amount of the threshold voltage of the first multi-bit cell.

Similarly, the multi-bit programming apparatus 700 may estimate a change amount of the threshold voltage of the second multi-bit cell after a predetermined time passes after programming based on a number of programmings and erasures of the second multi-bit cell, and may determine the second verification voltage based on the estimated change amount of the threshold voltage of the second multi-bit cell.

Figure 9:
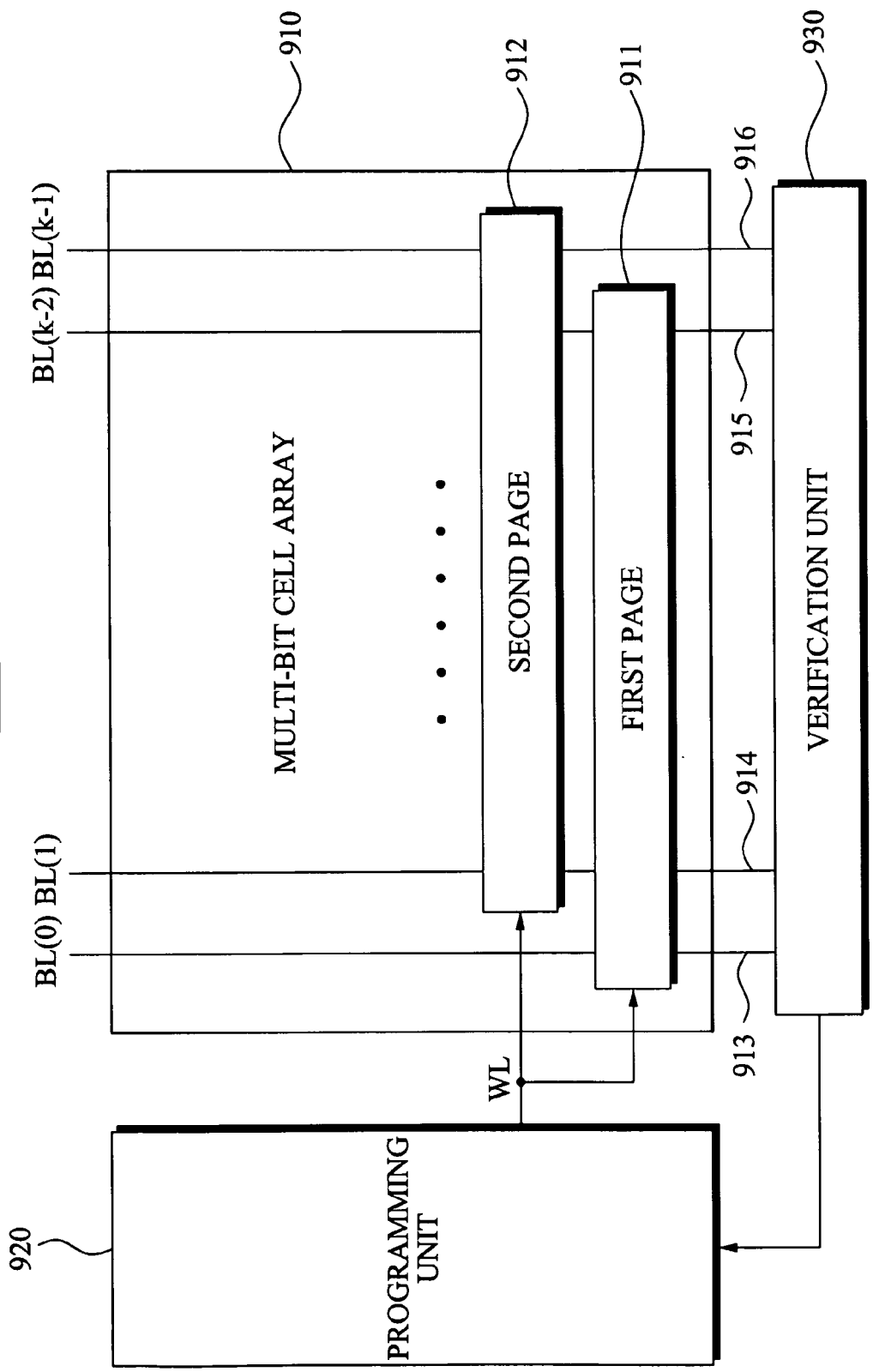
FIG. 9 is a diagram illustrating a multi-bit programming apparatus according to example embodiments.

FIG. 9 is a diagram illustrating a multi-bit programming apparatus according to example embodiment.

Referring to FIG. 9, the multi-bit programming apparatus 900 may include a multi-bit cell array 910, a programming unit 920, and a verification unit 930.

The multi-bit cell array 910 may include a first page 911 and a second page 912. The first page 911 may include a plurality of first multi-bit cells, and the second page 912 may include a plurality of second multi-bit cells.

All multi-bit cells included in the first page 911 and the second page 912 may be connected with a WL. Each of the first page 911 and the second page 912 may include k/2 multi-bit cells, k being an even natural number.

The first page 911 may include a multi-bit cell connected with a BL(0) 913 and a multi-bit cell connected with a BL(k-2) 915. The plurality of first multi-bit cells included in the first page 911 may include multi-bit cells connected with even bit lines of the multi-bit cells connected with the WL.

The second page 912 may include a multi-bit cell connected with a BL(1) 914 and a multi-bit cell connected with a BL(k-1) 916. The plurality of second multi-bit cells included in the second page 912 may include multi-bit cells connected with odd bit lines of the multi-bit cells connected with the WL.

The first verification voltage may be determined based on a fact that the plurality of first multi-bit cells is connected with the even bit lines.

The second verification voltage may be determined based on a fact that the plurality of second multi-bit cells is connected with the odd bit lines.

The programming unit 920 may program first data in the plurality of first multi-bit cells, and may program second data in the plurality of second multi-bit cells.

The verification unit 930 may verify whether the first data is programmed in the plurality of first multi-bit cells using a first verification voltage, and may verify whether the second data is programmed in the plurality of first multi-bit cells using a second verification voltage.

Figure 11:
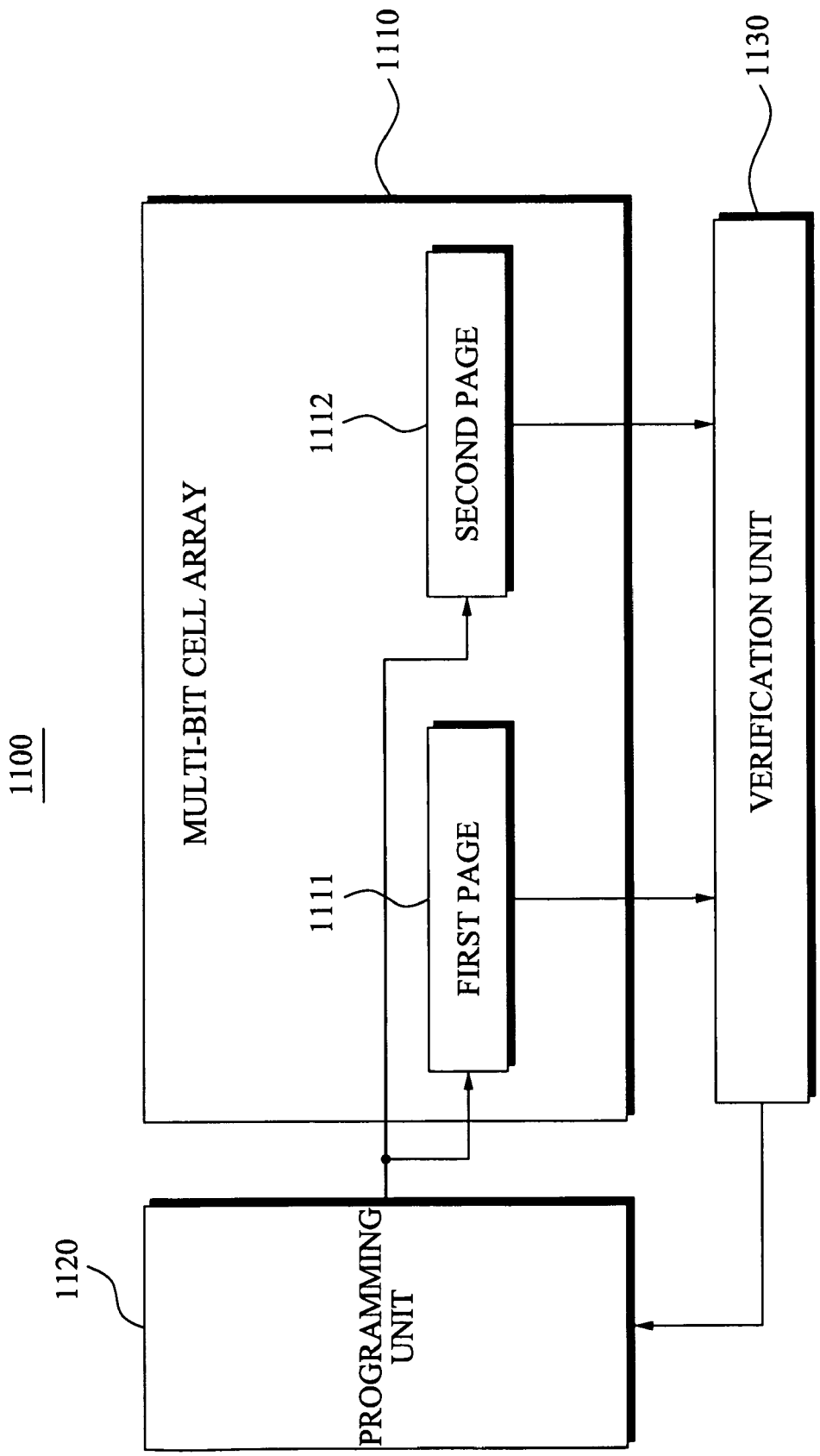
FIG. 11 is a diagram illustrating a multi-bit programming apparatus according to example embodiments.

FIG. 11 is a diagram illustrating a multi-bit programming apparatus 1100 according to example embodiments.

Referring to FIG. 11, the multi-bit programming apparatus 1100 may include a multi-bit cell array 1110, a programming unit 1120, and a verification unit 1130.

The multi-bit cell array 1110 may include a first page 1111 and a second page 1112. The first page 1111 may include a plurality of first multi-bit cells, and the second page 1112 may include a plurality of second multi-bit cells.

The programming unit 1120 may program first data in the plurality of first multi-bit cells, and may program second data in the plurality of second multi-bit cells.

The verification unit 1130 may verify whether the first data is programmed in the plurality of first multi-bit cells using a first verification voltage, and may verify whether the second data is programmed in the plurality of second multi-bit cells using a second verification voltage.

The programming unit 1120 may program the data in at least one of the plurality of first multi-bit cells and the plurality of second multi-bit cells by applying a high voltage to a gate terminal of at least one of the plurality of first multi-bit cells and the plurality of second multi-bit cells.

As illustrated in FIG. 11, the second page 1112 may be located farther from the programming unit 1120 than the first page 1111.

Generally, the programming unit 1120 may apply the high voltage to the gate terminal of at least one of the plurality of first multi-bit cells and the plurality of second multi-bit cells via a conductor line.

The conductor line may be formed of a metal including aluminum, copper, and the like, or may be formed of a doped poly-silicon.

In the multi-bit cell array 1110 having very high integration, the conductor line to the second page 1112, which may be located relatively farther from the programming unit 1120, may have a resistance and a parasitic capacitance greater than the conductor line to the first page 1111, which may be located relatively closer to the programming unit 1120.

Accordingly, the second high voltage applied from the programming unit 1120 to the second page 1112 may have a time delay longer than the first high voltage applied from the programming unit 1120 to the first page 1111. Additionally, for the programming unit 1120, it may be more difficult to control the second high voltage than to control the first high voltage.

In example embodiments, the threshold voltages of the plurality of second multi-bit cells of the second page 1112, which may be located relatively farther from the programming unit 1120, may have a distribution state that is more spread than the threshold voltages of the plurality of first multi-bit cells of the first page 1111, which may be located relatively closer to the programming unit 1120.

Depending on example embodiments, the multi-bit programming apparatus 1100 may estimate the distribution of the threshold voltages of the plurality of first multi-bit cells and the plurality of second multi-bit cells based on spatial distances of the first page 1111 and the programming unit 1120, and the second page 1112 and the programming unit 1120.

The multi-bit programming apparatus 1100 may determine the first verification voltage and the second verification voltage based on the estimated distribution of the threshold voltages.

In example embodiments, the multi-bit programming apparatus 1100 may estimate the distribution of the threshold voltages of the plurality of first multi-bit cells and the plurality of second multi-bit cells based on the parasitic capacitance and the resistance of the conductor line connected with the gate terminal of the plurality of first multi-bit cells and the plurality of second multi-bit cells.

Depending on example embodiments, the multi-bit programming apparatus 700 and the memory data detection apparatus 100 may be combined.

For example, as illustrated in FIG. 6 and FIG. 10, when the verification voltage and the detection voltage are adjusted based on the number of programmings and erasures of the multi-bit cells, the verification voltage of the multi-bit cells having the large number of programmings and erasures may be adjusted to be high, and the detection voltage of multi-bit cells having the large number of programmings and erasures may be adjusted to be low.

According to example embodiments, when the distribution of the threshold voltages is similar to that shown in FIG. 2 as a result of using the identical verification voltage for the first multi-bit cell and the second multi-bit cell, the multi-bit programming apparatus and the memory data detection apparatus (not illustrated) may apply the first detection voltage to the first multi-bit cell, and apply the second detection voltage to the second multi-bit cell.

According to still another example embodiment, when the distribution of the threshold voltage of the multi-bit cell is similar to that shown in FIG. 8, the multi-bit programming apparatus and the memory data detection apparatus (not illustrated) of the present example embodiment may apply the first verification voltage to the first multi-bit cell, and may apply the second verification voltage to the second multi-bit cell in order to apply the identical detection voltage to the first multi-bit cell and the second multi-bit cell.

According to example embodiments, the multi-bit programming apparatus may generate a better distribution of the threshold voltages of the multi-bit cells.

The multi-bit programming apparatus and the memory data detection apparatus may lower errors when reading data stored in the multi-bit cell when the data is detected from the multi-bit cell.

Figure 12:
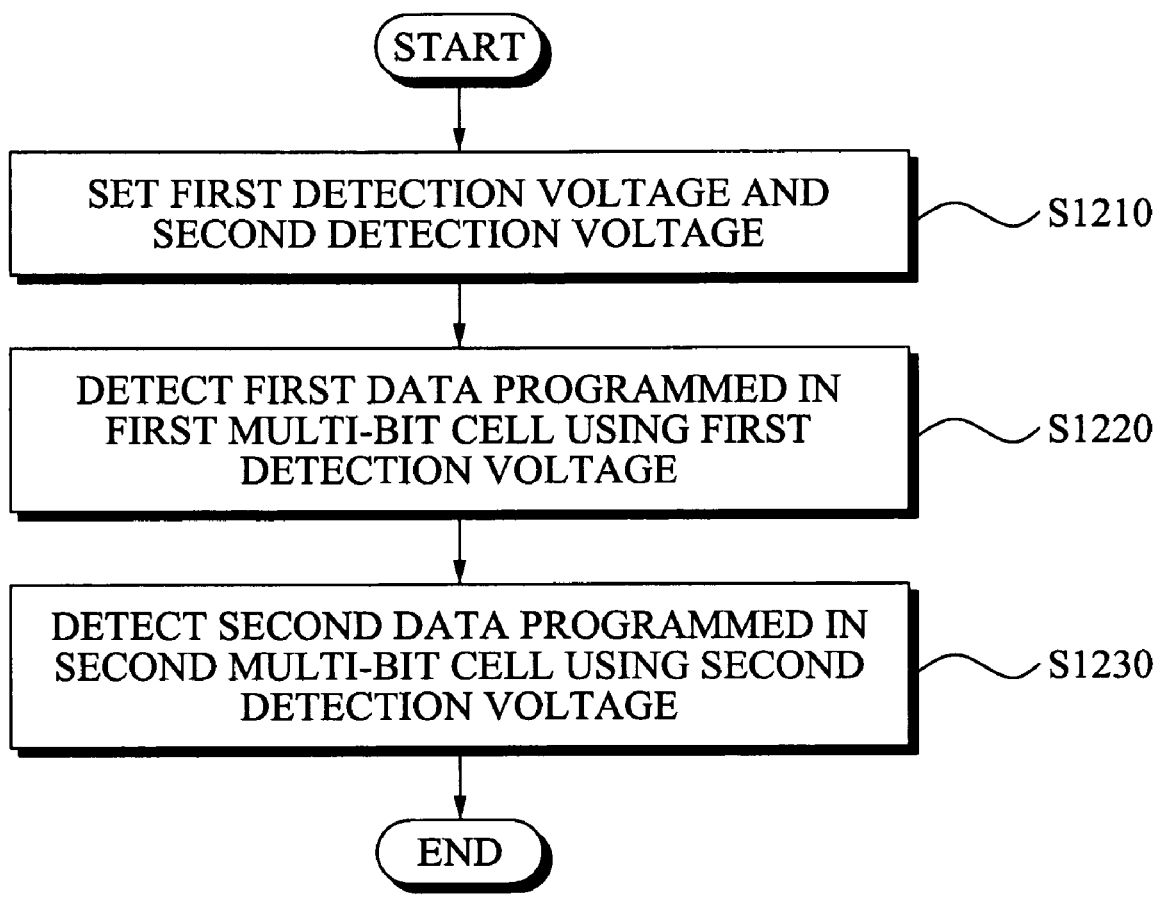
FIG. 12 is a flowchart illustrating a memory data detection method according to example embodiments.

FIG. 12 is a flowchart illustrating a memory data detection method according to example embodiments.

The memory data detection method may detect data from a multi-bit cell array including a first multi-bit cell and a second multi-bit cell.

Referring to FIG. 12, the memory data detection method may set a first detection voltage and a second detection voltage in operation S1210.

The memory data detection method may detect first data programmed in the first multi-bit cell using the first detection voltage in operation S1220.

The memory data detection method may detect second data programmed in the second multi-bit cell using the second detection voltage in operation S1230.

Depending on example embodiments, the first detection voltage and the second detection voltage may be set based on a spatial distance of the first multi-bit cell and the second multi-bit cell in operation S1210.

In operation S1210, the first detection voltage may be set based on whether the first multi-bit cell is connected with an even bit line, and the second detection voltage may be set based on whether the second multi-bit cell is connected with an odd bit line.

In operation S1210, the first detection voltage and the second detection voltage may be set based on the spatial distance of the first multi-bit cell and the second multi-bit cell from a high-voltage application circuit which may perform programming by applying a high voltage to a gate terminal of the first multi-bit cell and the second multi-bit cell.

Depending on example embodiments, the memory data detection method may program first original data in the first multi-bit cell.

The memory data detection method may program second original data in the second multi-bit cell.

The memory data detection method may determine whether the first data corresponds to the first original data first.

The memory data detection method may determine whether the second data corresponds to the second original data second.

The memory data detection method may generate first data error statistics of the first multi-bit cell based on a result of the first determination.

The memory data detection method may generate second data error statistics of the second multi-bit cell based on a result of the second determination.

In example embodiments, in operation S1210, the first detection voltage may be set based on the first data error statistics, and the second detection voltage may be set based on the second data error statistics.

Depending on example embodiments, the memory data detection method may set the first detection voltage based on a number of programmings and erasures of the first multi-bit cell, and may set the second detection voltage based on a number of programmings and erasures of the second multi-bit cell.

Figure 13:
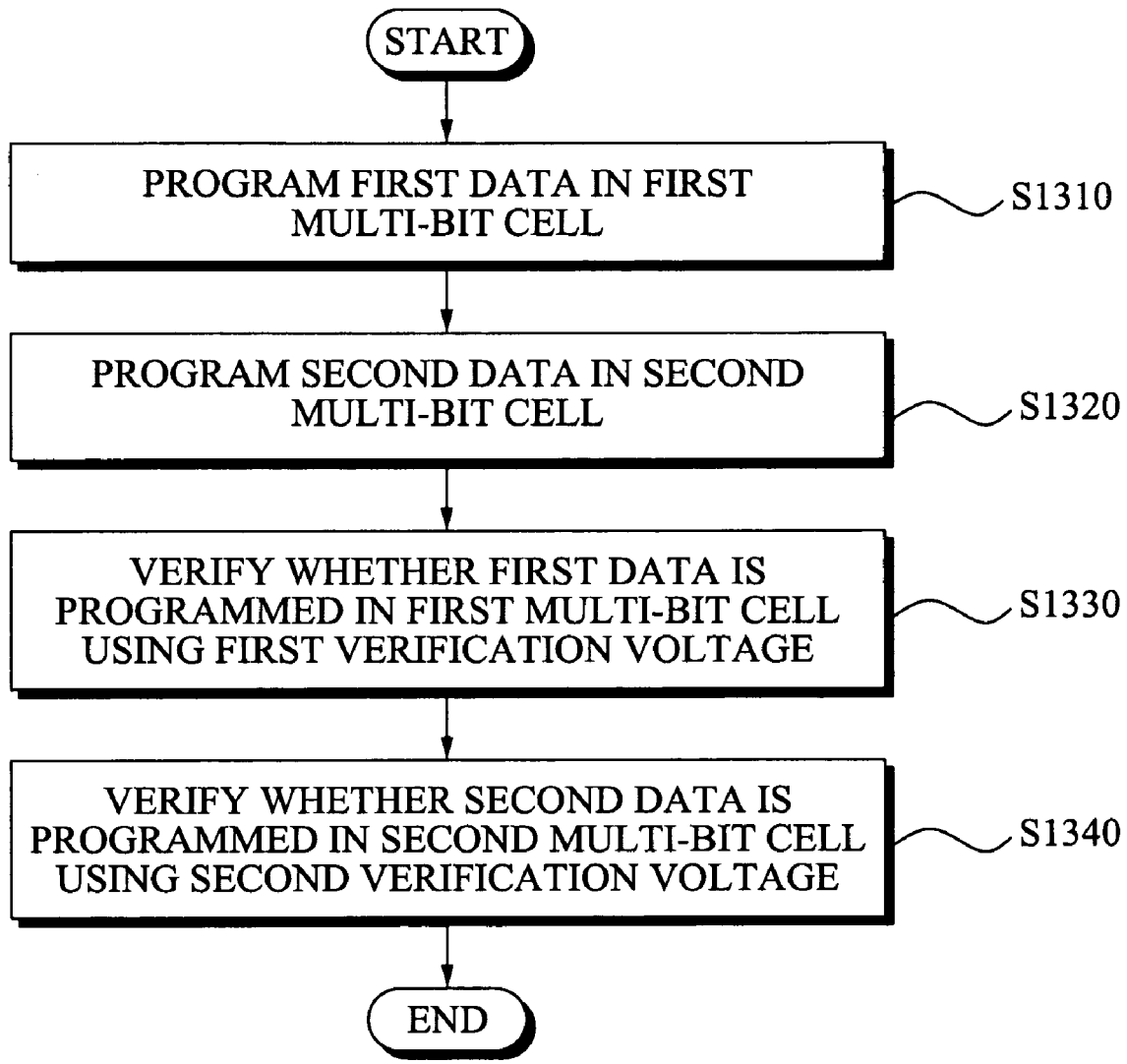
FIG. 13 is a flowchart illustrating a multi-bit programming method according to example embodiments.

FIG. 13 is a flowchart illustrating a multi-bit programming method according to an example embodiment.

The multi-bit programming method may program data in a multi-bit cell array including a first multi-bit cell and a second multi-bit cell.

Referring to FIG. 13, the multi-bit programming method may program first data in the first multi-bit cell in operation S1310.

The multi-bit programming method may program second data in the second multi-bit cell in operation S1320.

The multi-bit programming method may verify whether the first data is programmed in the first multi-bit cell using a first verification voltage in operation S1330.

Additionally, for both the first and second verification voltages and multi-bit cells, verification may include comparing the verification voltage and threshold voltages of the multi-bit cells, and determining whether to perform a programming operation of multi-bit cells based on a comparison result. The comparison and programming operations may take place repeatedly or until the detected threshold voltage is equal to or greater than a desired threshold voltage.

The multi-bit programming method may verify whether the second data is programmed in the second multi-bit cell using a second verification voltage in operation S1340.

Depending on example embodiments, the multi-bit programming method may determine the first verification voltage based on a spatial distance of the first multi-bit cell, and determine the second verification voltage based on a spatial distance of the second multi-bitcell.

In example embodiments, the multi-bit programming method may determine the first verification voltage based on whether the first multi-bit cell is connected with an even bit line, and determine the second verification voltage based on whether the second multi-bit cell is connected with an odd bit line.

In example embodiments, the multi-bit programming method may determine the first verification voltage based on a spatial distance of the first multi-bit cell from a high-voltage application circuit which may program the first multi-bit cell and the second multi-bit cell by applying a high voltage to a gate terminal of the first multi-bit cell and the second multi-bit cell, and may determine the second verification voltage based on a spatial distance of the second multi-bit cell from the high-voltage application circuit.

Depending on example embodiments, the multi-bit programming method may determine the first verification voltage based on a number of programmings and erasures of the first multi-bit cell, and may determine the second verification voltage based on a number of programmings and erasures of the second multi-bit cell.

One or both of the memory data detection method and the multi-bit programming method according to example embodiments may be recorded in computer-readable media including program instructions to implement various operations embodied by a computer. The media may also include, alone or in combination with the program instructions, data files, data structures, and the like. The media and program instructions may be those specially designed and constructed for the purposes of example embodiments, or they may be of the kind well-known and available to those having skill in the computer software arts. Examples of computer-readable media include magnetic media such as hard disks, floppy disks, and magnetic tape; optical media such as CD ROM disks and DVD; magneto-optical media such as optical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of example embodiments.

The foregoing descriptions of example embodiments have been presented for purposes of illustration and description. They are not intended to be exhaustive or to limit the example embodiments to the precise forms disclosed, and obviously many modifications and variations are possible in light of the above teaching. Therefore, it is intended that the scope of the example embodiments be defined by the claims appended thereto and their equivalents.

While example embodiments have been particularly shown and described, it will be understood by those of ordinary skill in the art that various changes in form and details may be made therein without departing from the spirit and scope of the example embodiments as defined by the following claims.

What is claimed is:

1. A multi-bit programming apparatus comprising:
   a multi-bit cell array that includes a first multi-bit cell and a second multi-bit cell;
   a programming unit for programming first data in the first multi-bit cell, and programming second data in the second multi-bit cell; and
   a verification unit for verifying whether the first data is programmed in the first multi-bit cell using a first verification voltage, and verifying whether the second data is programmed in the second multi-bit cell using a second verification voltage,
   wherein the programming unit is configured to program the first data and the second data in the first multi-bit cell and the second multi-bit cell by applying a high voltage to a gate terminal of the first multi-bit cell and the second multi-bit cell,
   the apparatus is configured to determine the first verification voltage based on a spatial distance between the first multi-bit cell and the programming unit, and
   the apparatus is configured to determine the second verification voltage based on a spatial distance between the second multi-bit cell and the programming unit, wherein the first verification voltage is different from the second verification voltage.

2. The apparatus of claim 1, wherein the apparatus is configured to determine the first verification voltage based on whether the first multi-bit cell is connected with an even bit line, and the apparatus is configured to determine the second verification voltage based on whether the second multi-bit cell is connected with an odd bit line.

3. The apparatus of claim 1, wherein the apparatus is configured to determine the first verification voltage based on a number of programmings and erasures of the first multi-bit cell, and
   the apparatus is configured to determine the second verification voltage based on a number of programmings and erasures of the second multi-bit cell.

4. The apparatus of claim 1, wherein the apparatus is configured to determine the first verification voltage and the second verification voltage based on which of the first multi-bit cell and the second multi-bit cell is first programmed.

5. The apparatus of claim 1, wherein the apparatus is configured to determine the first verification voltage based on first data error statistics of the first multi-bit cell, and
   the apparatus is configured to determine the second verification voltage based on second data error statistics of the second multi-bit cell.

6. A memory data detection apparatus comprising:
a multi-bit cell array that includes a first multi-bit cell and a second multi-bit cell;
a data detection unit for detecting first data programmed in the first multi-bit cell using a first detection voltage, and detecting second data programmed in the second multi-bit cell using a second detection voltage; and
a programming unit for programming data in at least one of the first multi-bit cell and the second multi-bit cell by applying a high voltage to a gate terminal of at least one of the first multi-bit cell and the second multi-bit cell,
wherein the apparatus is configured to determine the first detection voltage based on a spatial distance between the first multi-bit cell and the programming unit, and
the apparatus is configured to determine the second detection voltage based on a spatial distance of the second multi-bit cell and the programming unit, wherein the first detection voltage is different from the second detection voltage.

7. The apparatus of claim 6, wherein the apparatus is configured to determine the first detection voltage based on whether the first multi-bit cell is connected with an even bit line, and the apparatus is configured to determine the second detection voltage based on whether the second multi-bit cell is connected with an odd bit line.

8. The apparatus of claim 6, wherein the apparatus is configured to determine the first detection voltage based on a number of programmings and erasures of the first multi-bit cell, and
the apparatus is configured to determine the second detection voltage based on a number of programmings and erasures of the second multi-bit cell.

9. The apparatus of claim 6, wherein the apparatus is configured to determine the first detection voltage and the second detection voltage based on which of the first multi-bit cell and the second multi-bit cell is first programmed.

10. The apparatus of claim 6, wherein the apparatus is configured to determine the first detection voltage based on first data error statistics of the first multi-bit cell, and
the apparatus is configured to determine the second detection voltage based on second data error statistics of the second multi-bit cell.

11. The apparatus of claim 10, further comprising:
an error determination unit for determining whether the first data corresponds to first original data programmed in the first multi-bit cell, and whether the second data corresponds to second original data programmed in the second multi-bit cell,
wherein the apparatus is configured to generate the first data error statistics and the second data error statistics based on a determination result of the error determination unit.

12. A multi-bit programming method that programs data in a multi-bit cell array including a first multi-bit cell and a second multi-bit cell, the method comprising:
programming first data in the first multi-bit cell;
programming second data in the second multi-bit cell;
verifying whether the first data is programmed in the first multi-bit cell using a first verification voltage; and
verifying whether the second data is programmed in the second multi-bit cell using a second verification voltage,
wherein the first verification voltage is determined based on a spatial distance of the first multi-bit cell, and
the second verification voltage is determined based on a spatial distance of the second multi-bit cell, wherein the first verification voltage is different from the second verification voltage.

13. The method of claim 12, wherein the first verification voltage is determined based on a number of programmings and erasures of the first multi-bit cell, and
the second verification voltage is determined based on a number of programmings and erasures of the second multi-bit cell.

14. A memory data detection method that detects data from a multi-bit cell array including a first multi-bit cell and a second multi-bit cell, the method comprising:
setting a first detection voltage and a second detection voltage;
detecting first data programmed in the first multi-bit cell using the first detection voltage; and
detecting second data programmed in the second multi-bit cell using the second detection voltage,
wherein the setting sets the first detection voltage based on a spatial distance of the first multi-bit cell, and sets the second detection voltage based on a spatial distance of the second multi-bit cell.

15. The method of claim 14, further comprising:
programming first original data in the first multi-bit cell;
programming second original data in the second multi-bit cell;
determining whether the first data corresponds to the first original data;
determining whether the second data corresponds to the second original data;
generating first data error statistics of the first multi-bit cell based on a result of the first determination; and
generating second data error statistics of the second multi-bit cell based on a result of the second determination,
wherein the setting sets the first detection voltage based on the first data error statistics, and sets the second detection voltage based on the second data error statistics.

16. A non-transitory computer-readable storage medium storing a program for implementing a method that programs data in a multi-bit cell array including a first multi-bit cell and a second multi-bit cell, the method comprising:
programming first data in the first multi-bit cell;
programming second data in the second multi-bit cell;
verifying whether the first data is programmed in the first multi-bit cell using a first verification voltage; and
verifying whether the second data is programmed in the second multi-bit cell using a second verification voltage,
wherein the first verification voltage is determined based on a spatial distance of the first multi-bit cell, and
the second verification voltage is determined based on a spatial distance of the second multi-bit cell, wherein the first verification voltage is different from the second verification voltage.

17. A non-transitory computer-readable storage medium storing a program for implementing a method that detects data from a multi-bit cell array including a first multi-bit cell and a second multi-bit cell, the method comprising:
setting a first detection voltage and a second detection voltage;
detecting first data programmed in the first multi-bit cell using the first detection voltage; and
detecting second data programmed in the second multi-bit cell using the second detection voltage,
wherein the setting sets the first detection voltage based on a spatial distance of the first multi-bit cell, and sets the second detection voltage based on a spatial distance of the second multi-bit cell, wherein the first detection voltage is different from the second detection voltage.

* * * * *